United States Patent
Kuo et al.

(10) Patent No.: US 10,573,784 B2
(45) Date of Patent: Feb. 25, 2020

(54) MICRO LIGHT EMITTING DIODE STRUCTURE AND METHOD FOR MANUFACTURING MICRO LIGHT EMITTING DIODE

(71) Applicant: Lextar Electronics Corporation, Hsinchu (TW)

(72) Inventors: Shiou-Yi Kuo, Hsinchu (TW); Jun-Rong Chen, Hsinchu County (TW); Guo-Yi Shiu, Yunlin County (TW)

(73) Assignee: LEXITAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/038,202

(22) Filed: Jul. 18, 2018

(65) Prior Publication Data

US 2019/0081210 A1    Mar. 14, 2019

(30) Foreign Application Priority Data

Sep. 11, 2017   (CN) .......................... 2017 1 0812047

(51) Int. Cl.
*H01L 33/32* (2010.01)
*B32B 7/12* (2006.01)
(Continued)

(52) U.S. Cl.
CPC .............. *H01L 33/325* (2013.01); *B32B 7/12* (2013.01); *H01L 33/0075* (2013.01); *H01L 33/0079* (2013.01); *H01L 33/30* (2013.01); *H01L 33/44* (2013.01); *H01L 33/007* (2013.01); *H01L 33/32* (2013.01); *H01L 33/62* (2013.01); *H01L 2933/0025* (2013.01)

(58) Field of Classification Search
CPC combination set(s) only.
See application file for complete search history.

(56) References Cited

U.S. PATENT DOCUMENTS 5,286,335 A     2/1994  Drabik et al.
2009/0302334 A1*  12/2009  Yao .......................... F21K 9/00
                                                        257/93

(Continued)

FOREIGN PATENT DOCUMENTS

CN       103730544 A      4/2014
CN       106816408 A      6/2017

*Primary Examiner* — Ratisha Mehta
(74) *Attorney, Agent, or Firm* — CKC & Partners Co., LLC

(57) ABSTRACT

A micro light emitting diode includes a die-bonding substrate, an adhesive layer, an undoped III-V group semiconductor layer, an N-type III-V group semiconductor layer, a light emitting layer, and a P-type III-V group semiconductor layer. The adhesive layer is disposed on the die-bonding substrate. The undoped III-V group semiconductor layer is disposed on the adhesive layer, and the adhesive layer is between the die-bonding substrate and the undoped III-V group semiconductor layer. The N-type III-V group semiconductor layer is disposed on the undoped III-V group semiconductor layer. The light emitting layer is disposed on the N-type III-V group semiconductor layer. The P-type III-V group semiconductor layer is disposed on the N-type III-V group semiconductor layer, and the light emitting layer is between the N-type III-V group semiconductor layer and the P-type III-V group semiconductor layer.

3 Claims, 6 Drawing Sheets

(51) Int. Cl.
*H01L 33/00* (2010.01)
*H01L 33/44* (2010.01)
*H01L 33/30* (2010.01)
*H01L 33/62* (2010.01)

(56) References Cited

U.S. PATENT DOCUMENTS

2011/0254036 A1* 10/2011 Kim .................. H01L 33/20
　　　　　　　　　　　　　　　　　　　　257/98
2017/0236807 A1* 8/2017 Hwang .................. H01L 33/32
　　　　　　　　　　　　　　　　　　　　257/90

* cited by examiner

MICRO LIGHT EMITTING DIODE STRUCTURE AND METHOD FOR MANUFACTURING MICRO LIGHT EMITTING DIODE

RELATED APPLICATION

This application claims priority to China Application Serial Number 201710812047.1, filed Sep. 11, 2017, which is herein incorporated by reference.

BACKGROUND

Field of Invention

The present invention relates to a micro light emitting diode structure and a method for manufacturing the micro light emitting diode.

Description of Related Art

As comparing to the conventional light emitting diode, the size of the micro light emitting diode (micro LED) is reduced to a level of micron meters (μm), and the target yield of manufacturing the micro LEDs is aimed to be over 99%. However, conventional processes of fabricating micro LEDs face various technical challenges, in which the mass transfer technology is the most crucial process. Furthermore, many other technical problems need to be resolved, for example the precision of the equipment, the transfer yields, the transfer time, the rework property, and the processing cost.

SUMMARY

The present disclosure provides a micro light emitting diode structure. The micro light emitting diode includes a die-bonding substrate, an adhesive layer, an undoped III-V group semiconductor layer, an N-type III-V group semiconductor layer, a light emitting layer, and a P-type III-V group semiconductor layer. The adhesive layer is disposed on the die-bonding substrate. The undoped III-V group semiconductor layer is disposed on the adhesive layer, and the adhesive layer is between the die-bonding substrate and the undoped III-V group semiconductor layer. The N-type III-V group semiconductor layer is disposed on the undoped III-V group semiconductor layer. The light emitting layer is disposed on the N-type III-V group semiconductor layer. The P-type III-V group semiconductor layer is disposed on the N-type III-V group semiconductor layer, and the light emitting layer is between the N-type III-V group semiconductor layer and the P-type III-V group semiconductor layer.

In some embodiments of the present disclosure, the undoped III-V group semiconductor layer, the N-type III-V group semiconductor layer, the light emitting layer, and the P-type III-V group semiconductor layer collectively have a total thickness H ranged from about 1 um to about 5 um.

In some embodiments of the present disclosure, the micro light emitting diode structure further comprises an insulating layer. The insulating layer 290 at least covers a side wall of the undoped III-V group semiconductor layer, a side wall of the N-type III-V group semiconductor layer, a side wall of the light emitting layer, and a side wall of the P-type III-V group semiconductor layer.

In some embodiments of the present disclosure, the insulating layer has a thickness ranged from about 500 Å to about 10000 Å.

In some embodiments of the present disclosure, the insulating layer has an extension portion. The extension portion extends from a junction of the side wall of the undoped III-V group semiconductor layer and the adhesive layer, and the extension portion is disposed over the adhesive layer.

The present disclosure provides a method for manufacturing the micro light emitting diode. The method includes the operations described below. A substrate is firstly provided. An III-V group semiconductor stacking layer is formed over the substrate. A sacrificial layer is formed on the III-V group semiconductor stacking layer such that the III-V group semiconductor stacking layer is disposed between the substrate and the sacrificial layer. A micro light emitting diode structure is formed on the sacrificial layer, and the micro light emitting diode structure has a bottom width which is less than a top width of the sacrificial layer such that a portion of a top surface of the sacrificial layer is exposed. An insulating layer is formed and continuously covering the III-V group semiconductor stacking layer, the sacrificial layer, the micro light emitting diode structure, and the portion of the top surface of the sacrificial layer. Next, the insulating layer which is disposed on the portion of the top surface of the sacrificial layer is selectively removed to expose the portion of the top surface of the sacrificial layer. The sacrificial layer is removed such that a portion of the insulating layer constitutes a supporting frame supporting the micro light emitting diode structure. The micro light emitting diode structure is suspended over the III-V group semiconductor stacking layer by the supporting frame. The supporting frame of the insulating layer is broken, and an individual micro light emitting diode is formed.

In some embodiments of the present disclosure, the sacrificial layer comprises a first N-type III-V group semiconductor layer, and the first N-type III-V group semiconductor layer has a first silicon doping concentration greater than about $3\times10^{19}$ cm$^{-3}$.

In some embodiments of the present disclosure, the III-V group semiconductor stacking layer comprises a second N-type III-V group semiconductor layer, and the second N-type III-V group semiconductor layer has a second silicon doping concentration ranged from about $1\times10^{18}$ cm$^{-3}$ to about $1\times10^{19}$ cm$^{-3}$.

In some embodiments of the present disclosure, the micro light emitting diode structure comprises a third N-type III-V group semiconductor layer, and the third N-type III-V group semiconductor layer has a third silicon doping concentration ranged from about $1\times10^{18}$ cm$^{-3}$ to about $1\times10^{19}$ cm$^{-3}$.

In some embodiments of the present disclosure, the insulating layer has a thickness ranged from about 500 Å to about 10000 Å.

In some embodiments of the present disclosure, the method further includes that the individual micro light emitting diode is disposed on a die-bonding substrate after breaking the supporting frame of the insulating layer.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
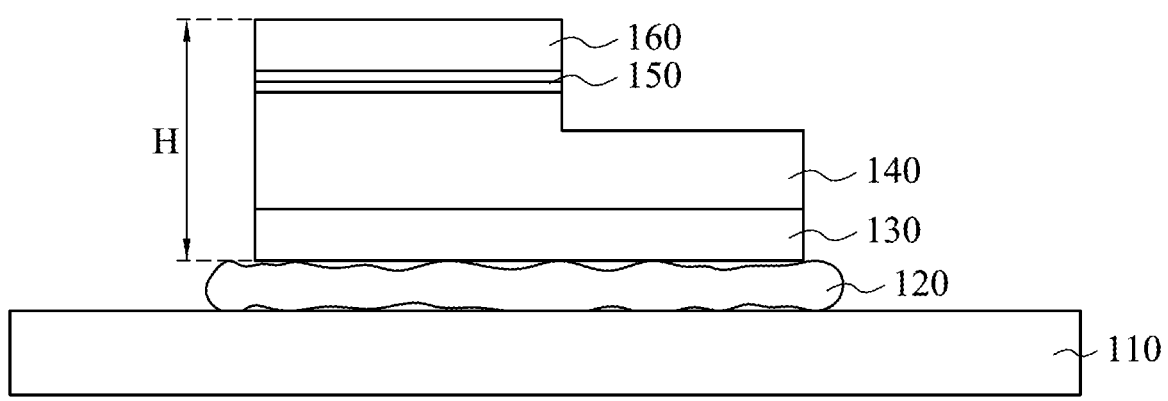
FIG. 1 is a cross-section view of the micro light emitting diode structure in accordance with various embodiments of the present disclosure.
Figure 2:
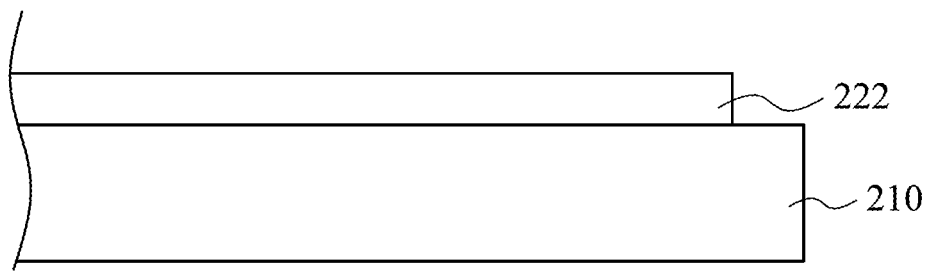
FIG. 2 is a cross-section view in one stage of a manufacturing process in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-section view of the micro light emitting diode structure 100 in accordance with various embodiments of the present disclosure. Referring to FIG. 1, the micro light emitting diode structure 100 includes a die-bonding substrate 110, an adhesive layer 120, an undoped III-V group semiconductor layer 130, an N-type III-V group semiconductor layer 140, a light emitting layer 150, and a P-type III-V group semiconductor layer 160. The adhesive layer 120 is disposed over the die-bonding substrate 110 as shown in FIG. 1. In some embodiments of the present disclosure, the die-bonding substrate 110 may be a rigid printed circuit board, an aluminum substrate with high thermal conductivity coefficient, a ceramic substrate, a flexible printed circuit board, a metal-composite board, a light emitting substrate or a semiconductor substrate with functional elements such as transistors and integrated circuits (ICs). In some embodiments of the present disclosure, the materials of the adhesive layer 120 may include insulation glue, conductive glue and/or metals. For example, the materials of the adhesive layer 120 may be insulation glue such as epoxy resins or silicones; the materials of the adhesive layer 120 may be conductive glue such as epoxy resins mixed with silver powders; the materials of the adhesive layer 120 may be metals such as copper, aluminum, tin and/or zinc, but not limited thereto.

As shown in FIG. 1, the undoped III-V group semiconductor layer 130 is disposed over the adhesive layer 120, and the adhesive layer 120 is interposed between the die-bonding substrate 110 and the undoped III-V group semiconductor layer 130. In some embodiments of the present disclosure, the undoped III-V group semiconductor layer 130 may be any III-V group semiconductor layers. For example, the materials of the III-V group semiconductor layer may include GaN, AlN, InN, InP, GaAs, InGaAlN, InGaAlP, InGaAlAs, GaAlPAs, or a combination thereof. In one embodiment of the present disclosure, the undoped III-V group semiconductor layer 130 is an undoped GaN semiconductor layer.

Referring to FIG. 1, the N-type III-V group semiconductor layer 140 is disposed on the undoped III-V group semiconductor layer 130, and the light emitting layer 150 is disposed on the N-type III-V group semiconductor layer 140. The P-type III-V group semiconductor layer 160 is disposed over the N-type III-V group semiconductor layer 140, and the light emitting layer 150 is disposed between the N-type III-V group semiconductor layer 140 and the P-type III-V group semiconductor layer 160. In some embodiments of the present disclosure, the N-type III-V group semiconductor layer 140 may be formed by doping the group IVA elements (such as silicon) of the III-V group semiconductor layer mentioned above. In one embodiment of the present disclosure, the N-type III-V group semiconductor layer 140 is a silicon-doping GaN semiconductor layer. In some embodiments of the present disclosure, the light emitting layer 150 may be a multiple quantum well. In some embodiments of the present disclosure, the P-type III-V group semiconductor layer 160 may be formed by doping the group IIA elements (such as magnesium, calcium, or strontium) of the III-V group semiconductor layer mentioned above. In one embodiment of the present disclosure, the P-type III-V group semiconductor layer 160 is a magnesium-doping GaN semiconductor layer.

In some embodiments of the present disclosure, in the micro light emitting diode structure 100, the undoped III-V group semiconductor layer 130, the N-type III-V group semiconductor layer 140, the light emitting layer 150, and the P-type III-V group semiconductor layer 160 collectively have a total thickness H ranged from about 1 um to about 5 um.

Figure 11:
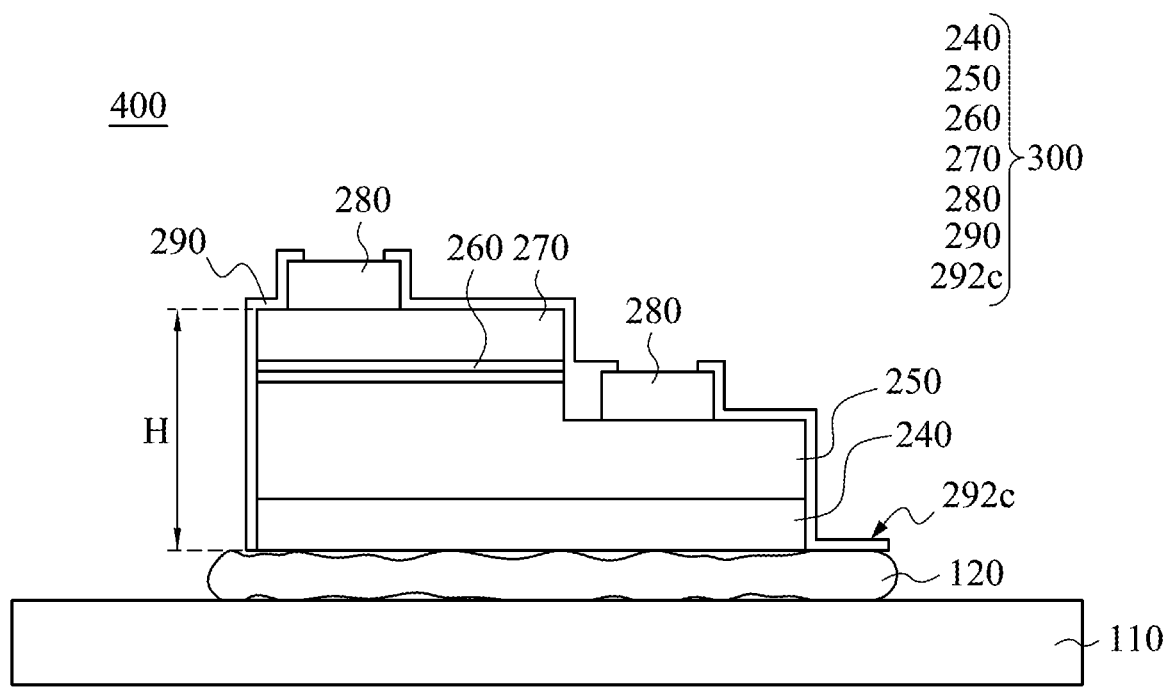
FIG. 11 is a cross-section view of the micro light emitting diode structure in accordance with various embodiments of the present disclosure.

FIG. 11 is a cross-section view of the micro light emitting diode structure 400 in accordance with various embodiments of the present disclosure. The micro light emitting diode structure 400 may further include an insulating layer 290 as shown in FIG. 11. The insulating layer 290 at least covers a side wall of the undoped III-V group semiconductor layer 240, a side wall of the N-type III-V group semiconductor layer 250, a side wall of the light emitting layer 260, and a side wall of the P-type III-V group semiconductor layer 270. In some embodiments of the present disclosure, the materials of the insulating layer 290 may include silicon oxide, silicon nitride, silicon oxynitride, epoxy resins, or other suitable insulating material. In some embodiments of the present disclosure, the insulating layer 290 has a thickness ranged from about 500 Å to about 10000 Å. According to various embodiments, when the thickness of the insulating layer 290 is greater than a certain value such as 10000 Å, it will lead to increase of manufacturing costs. On the contrary, when the thickness of the insulating layer 290 is less than a certain value such as 500 Å, it will cause the lack of support force provided in the process, and the details will be described in more detail below. Therefore, the thickness of the insulating layer 290 may be 600 Å, 700 Å, 800 Å, 900 Å, 1000 Å, 2000 Å, 2500 Å, 3000 Å, 3500 Å, 4000 Å, 4500 Å, 5000 Å, 5500 Å, 6000 Å, 6500 Å, 7000 Å, 7500 Å, 8000 Å, 8500 Å, 9000 Å, or 9500 Å, for example. It is noted that the insulating layer 290 may further include an extension portion 292c. In some embodiments, the extension portion 292c of the insulating layer 290 extends from a junction of the side wall of the undoped III-V group semiconductor layer 240 and the adhesive layer 120 along the direction parallel to the normal vector of said side wall to the adhesive layer 120. The extension portion 292c may be used to enhance the area of die-bonding.

Another aspect of the present invention is to provide a method for manufacturing a micro light emitting diode. FIG. 2 through FIG. 11 are cross-section views illustrating different process stages of the method for manufacturing the micro light emitting diode in accordance with various embodiments of the present disclosure. Please refer to FIG. 2. First, a substrate 210 is provided, and a first undoped III-V group semiconductor layer 222 is formed over the substrate 210. In some embodiments of the present disclosure, the substrate 210 may include any suitable substrates, for example, silicon substrates, SiC substrates, GaAs substrate, GaN substrate, and sapphire ($Al_2O_3$) substrate, but not limited thereto. In some embodiments of the present disclosure, the first undoped III-V group semiconductor layer 222 may be any III-V group semiconductor layers, and the materials thereof may include GaN, AlN, InN, InP, GaAs, InGaAlN, InGaAlP, InGaAlAs, GaAlPAs, or a combination thereof. In one embodiment of the present disclosure, the first undoped III-V group semiconductor layer 222 is an undoped GaN semiconductor layer. In some embodiments of the present disclosure, the first undoped III-V group semiconductor layer 222 may be formed over the substrate 210 by using metal organic chemical-vapor deposition (MOCVD) processes, liquid phase epitaxy (LPE) processes, or molecular beam epitaxy (MBE) processes.

Figure 3:
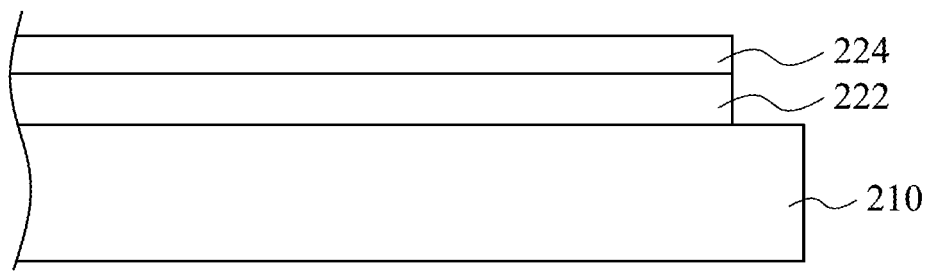
FIG. 3 is a cross-section view in one stage of a manufacturing process in accordance with various embodiments of the present disclosure.

Please refer to FIG. 3. Next, a first N-type III-V group semiconductor layer 224 is formed on the first undoped III-V group semiconductor layer 222. In some embodiments of the present disclosure, the first N-type III-V group semiconductor layer 224 may be formed by doping the group IVA elements (such as silicon) of the III-V group semiconductor layer mentioned above. More specifically, the N-type III-V group semiconductor layer 224 may be formed by the way of ion implantation. In one embodiment of the present disclosure, the N-type III-V group semiconductor layer 224 is a silicon-doping GaN semiconductor layer. In some embodiments of the present disclosure, the first N-type III-V group semiconductor layer 224 may be formed over the first undoped III-V group semiconductor layer 222 by using metal organic chemical-vapor deposition, liquid phase epitaxy, or molecular beam epitaxy.

Figure 4:
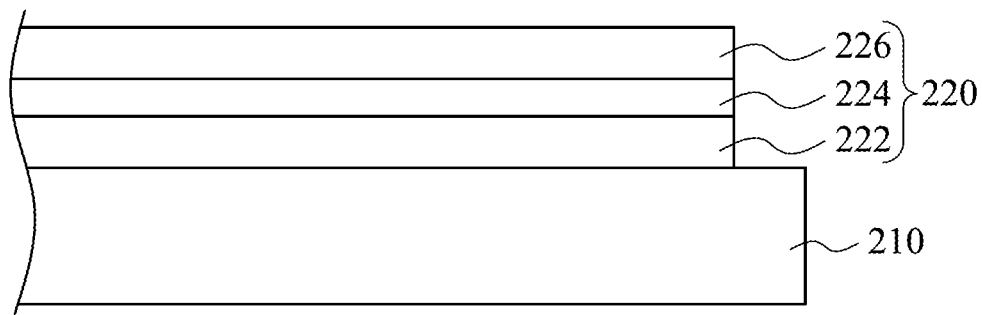
FIG. 4 is a cross-section view in one stage of a manufacturing process in accordance with various embodiments of the present disclosure.

Referring to FIG. 4, a second undoped III-V group semiconductor layer 226 is subsequently formed on the first N-type III-V group semiconductor layer 224. In some embodiments of the present disclosure, the material of the second undoped III-V group semiconductor layer 226 may be the same as or similar to the material of the first undoped III-V group semiconductor layer 222. In one embodiment of the present disclosure, the second undoped III-V group semiconductor layer 226 is an undoped GaN semiconductor layer. In some embodiments of the present disclosure, the method for forming the second undoped III-V group semiconductor layer 226 may be the same as or similar to the method for forming the first undoped III-V group semiconductor layer 222. In some embodiments of the present disclosure, the collection of the first undoped III-V group semiconductor layer 222, the first N-type III-V group semiconductor layer 224, and the second undoped III-V group semiconductor layer 226 may be referred to as a III-V group semiconductor stacking layer 220.

In some embodiments, the silicon doping concentration of the first N-type III-V group semiconductor layer 224 in the III-V group semiconductor stacking layer 220 is ranged from about $1\times10^{18}$ $cm^{-3}$ to about $1\times10^{19}$ $cm^{-3}$. The range of the silicon doping concentration of the first N-type III-V group semiconductor layer 224 mentioned above has a special technical effect, and the details will be described in more detail below. For example, the silicon doping concentration of the first N-type III-V group semiconductor layer 224 in the III-V group semiconductor stacking layer 220 may be $2\times10^{18}$ $cm^{-3}$, $3\times10^{18}$ $cm^{-3}$, $4\times10^{18}$ $cm^{-3}$, $5\times10^{18}$ $cm^{-3}$, $6\times10^{18}$ $cm^{-3}$, $7\times10^{18}$ $cm^{-3}$, $8\times10^{18}$ $cm^{-3}$, or $9\times10^{18}$ $cm^{-3}$.

Figure 5:
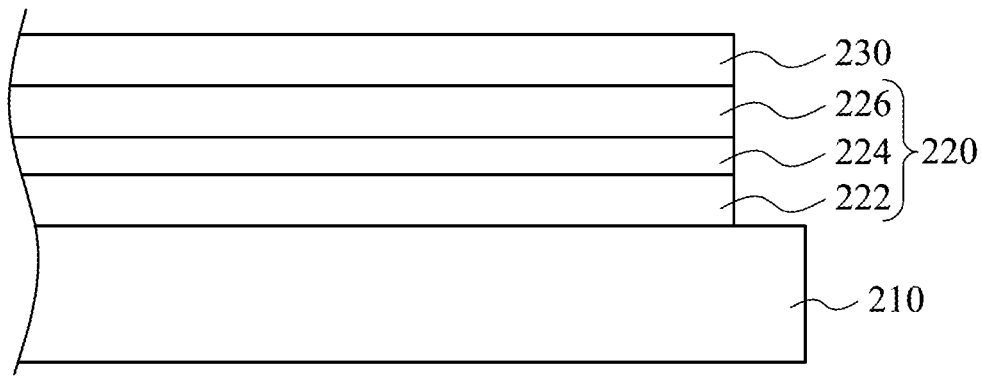
FIG. 5 is a cross-section view in one stage of a manufacturing process in accordance with various embodiments of the present disclosure.

Referring to FIG. 5, a sacrificial layer 230 is formed on the III-V group semiconductor stacking layer 220 such that the III-V group semiconductor stacking layer 220 is interposed between the substrate 210 and the sacrificial layer 230. In some embodiments of the present disclosure, the sacrificial layer 230 includes a second N-type III-V group semiconductor layer. In some embodiments of the present disclosure, the material of the sacrificial layer 230 may be the same as or similar to the material of the first N-type III-V group semiconductor layer 224 in the III-V group semiconductor stacking layer 220. To be specific, the sacrificial layer 230 may include a silicon-doping III-V group semiconductor layer. In one embodiment of the present disclosure, the sacrificial layer 230 is a silicon-doping GaN semiconductor layer. More specifically, the silicon doping concentration of the sacrificial layer 230 is greater than about $3\times10^{19}$ $cm^{-3}$, which is used to gather currents to the sacrificial layer 230 in the subsequent electrochemical selective etching process, and enhance the etching rate of the sacrificial layer 230. In some embodiments of the present disclosure, the sacrificial layer 230 may be formed on the III-V group semiconductor stacking layer 220 by using metal organic chemical-vapor deposition processes, liquid phase epitaxy processes, or molecular beam epitaxy processes.

Figure 6:
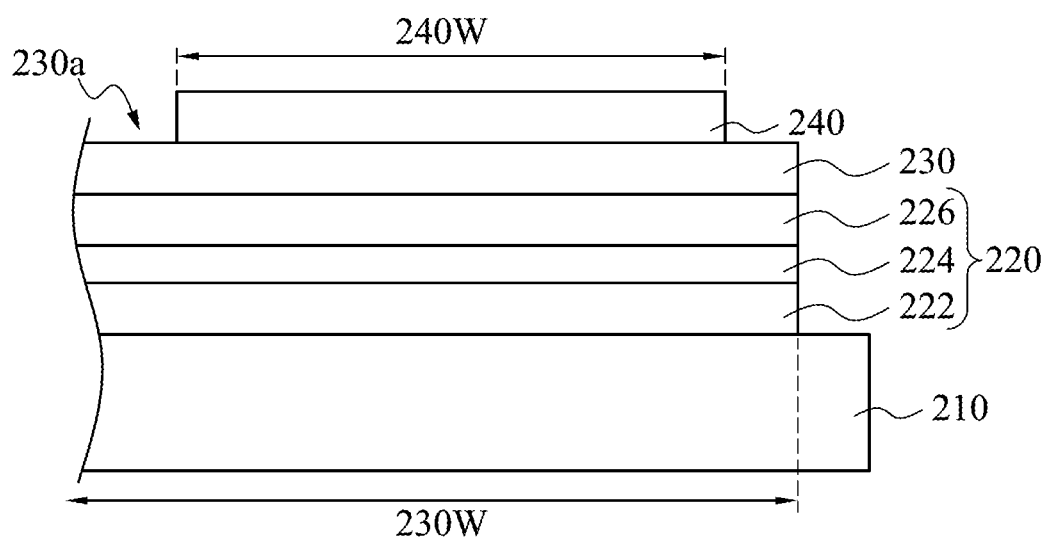
FIG. 6 is a cross-section view in one stage of a manufacturing process in accordance with various embodiments of the present disclosure.
Figure 7:
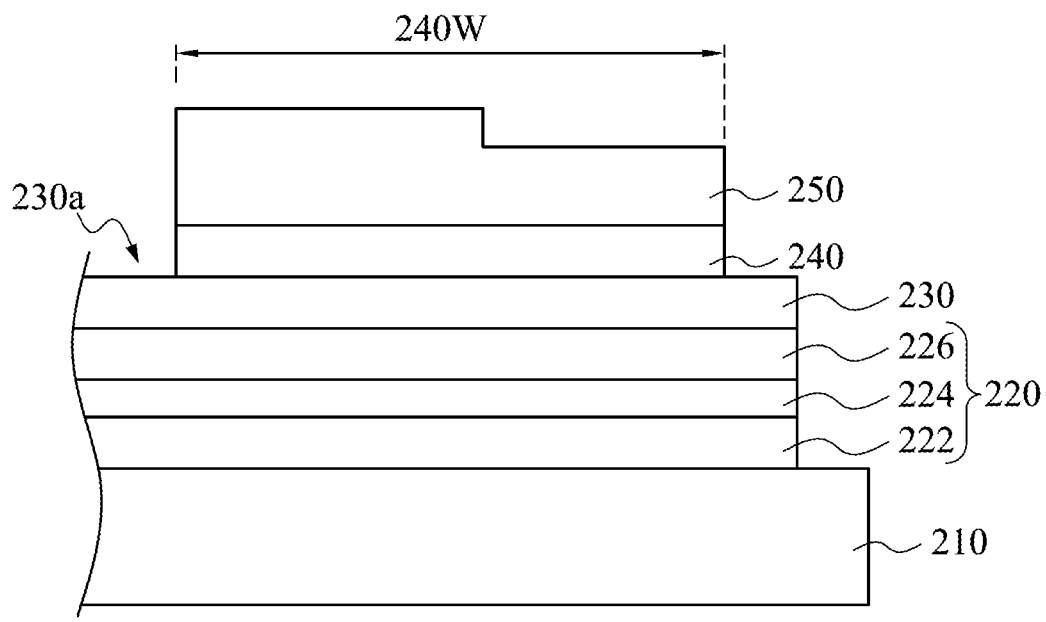
FIG. 7 is a cross-section view in one stage of a manufacturing process in accordance with various embodiments of the present disclosure.
Figure 8:
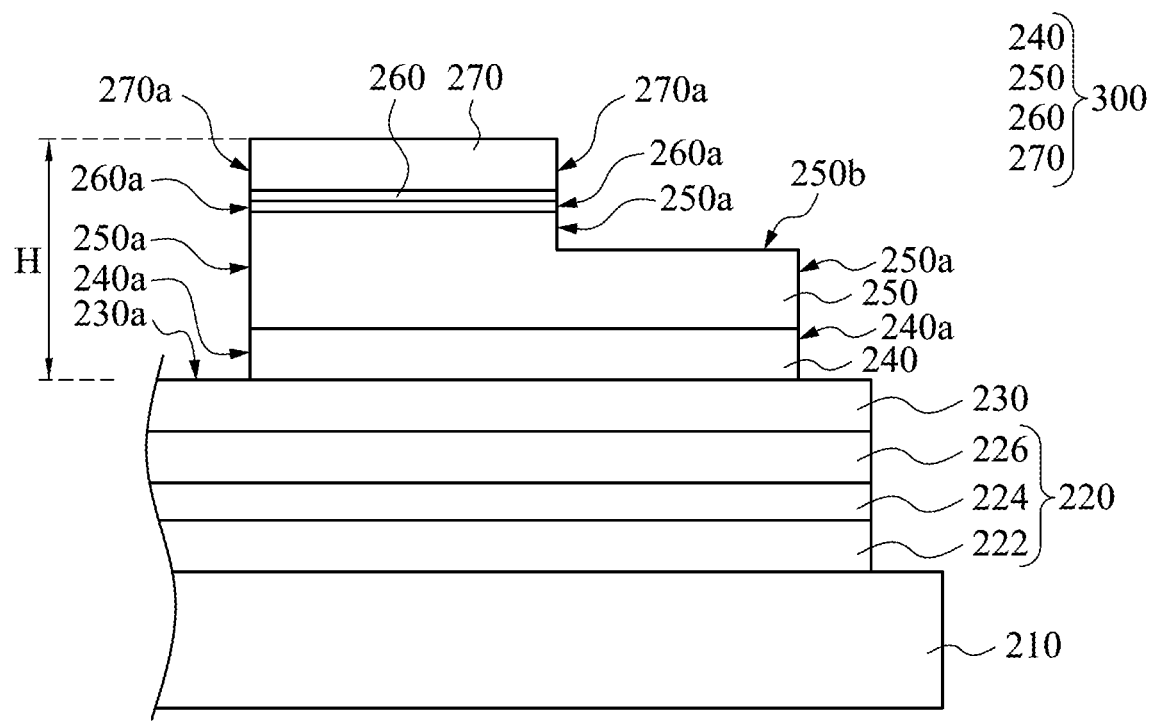
FIG. 8 is a cross-section view in one stage of a manufacturing process in accordance with various embodiments of the present disclosure.

Please refer to FIG. 6 through FIG. 8. FIG. 6 through FIG. 8 shown detail steps for forming the micro light emitting diode structure 300 (shown in FIG. 8) on the sacrificial layer 230. As shown in FIG. 6, a third undoped III-V group semiconductor layer 240 is formed on the sacrificial layer 230. In some embodiments of the present disclosure, the material of the third undoped III-V group semiconductor layer 240 may be the same as or similar to the material of the first undoped III-V group semiconductor layer 222 and the second undoped III-V group semiconductor layer 226. In one embodiment of the present disclosure, the third undoped III-V group semiconductor layer 240 is an undoped GaN semiconductor layer. In some embodiments of the present disclosure, the method for forming the third undoped III-V group semiconductor layer 240 may be the same as or similar to the method for forming the first undoped III-V group semiconductor layer 222 and method for forming the second undoped III-V group semiconductor layer 226. It is noted that a bottom width 240W of the third undoped III-V group semiconductor layer 240 is less than a top surface width 230W of the sacrificial layer 230 to expose a portion 230a of the top surface of the sacrificial layer 230.

Please refer to FIG. 7. A third N-type III-V group semiconductor layer 250 is formed on the third undoped III-V group semiconductor layer 240. In some embodiments of the present disclosure, the third N-type III-V group semiconductor layer 250 may be formed by doping one of the group IVA elements (such as silicon) into the III-V group semiconductor layer mentioned above. More specifically, the third N-type III-V group semiconductor layer 250 may be formed by ion implantation processes. In one embodiment of the present disclosure, the third N-type III-V group semiconductor layer 250 is a silicon-doping GaN semiconductor layer. More specifically, the silicon doping concentration of the third N-type III-V group semiconductor layer

250 is ranged from about $1\times10^{18}$ cm$^{-3}$ to about $1\times10^{19}$ cm$^{-3}$. According to various embodiments, when the silicon doping concentration of the third N-type III-V group semiconductor layer 250 is greater than a certain value such as for example $1\times10^{19}$ cm$^{-3}$, the third N-type III-V group semiconductor layer 250 has conductor (such as metal) properties, and losses the semiconductor conductivity which may be changed as the external electric field changes. On the contrary, when the silicon doping concentration of the third N-type III-V group semiconductor layer 250 is less than a certain value such as for example $1\times10^{18}$ cm$^{-3}$, it cannot provide sufficient free electrons, thereby undesirably affecting the overall photoelectric conversion efficiency of the micro light emitting diode. Therefore, the silicon doping concentration of the third N-type III-V group semiconductor layer 250 may be $2\times10^{18}$ cm$^{-3}$, $3\times10^{18}$ cm$^{-3}$, $4\times10^{18}$ cm$^{-3}$, $5\times10^{18}$ cm$^{-3}$, $6\times10^{18}$ cm$^{-3}$, $7\times10^{18}$ cm$^{-3}$, $8\times10^{18}$ cm$^{-3}$, or $9\times10^{18}$ cm$^{-3}$, for example. In some embodiments of the present disclosure, the third N-type III-V group semiconductor layer 250 may be formed over the third undoped III-V group semiconductor layer 240 by using metal organic chemical-vapor deposition processes, liquid phase epitaxy processes, or molecular beam epitaxy processes. As shown in FIG. 7, the cross-section of the third N-type III-V group semiconductor layer 250 has a stepped profile, and the bottom width of the third N-type III-V group semiconductor layer 250 is substantially the same as the bottom width 240W of the third undoped III-V group semiconductor layer 240.

Please refer to FIG. 8. The light emitting layer 260 and the P-type III-V group semiconductor layer 270 are formed in sequence on the third N-type III-V group semiconductor layer 250. To be specific, the light emitting layer 260 partially covers the top surface of the third N-type III-V group semiconductor layer 250 to expose a portion of the top surface 250b of the third N-type III-V group semiconductor layer 250. Next, the P-type III-V group semiconductor layer 270 fully covers the light emitting layer 260. In some embodiments of the present disclosure, the light emitting layer 260 may be a multiple quantum well. In some embodiments of the present disclosure, the P-type III-V group semiconductor layer 270 may be formed by doping one of the group IIA elements (such as beryllium, magnesium, calcium, or strontium) into the III-V group semiconductor layer mentioned above. In one embodiment of the present disclosure, the P-type III-V group semiconductor layer 270 is a magnesium-doping GaN semiconductor layer. In some embodiments of the present disclosure, the light emitting layer 260 may be formed on the third N-type III-V group semiconductor layer 250 by the way of MOCVD, LPE, or MBE. In some embodiments of the present disclosure, the P-type III-V group semiconductor layer 270 may be formed on the light emitting layer 260 by the same way of MOCVD, LPE, or MBE.

Referring to FIG. 8, in some embodiments of the present disclosure, the third undoped III-V group semiconductor layer 240, the third N-type III-V group semiconductor layer 250, the light emitting layer 260, and the P-type III-V group semiconductor layer 270 collectively have a total thickness H ranged from about 5 um to about 1 um. According to various embodiments, it the total thickness H is greater than a certain value such as 90 um, such micro light emitting diode structure is not belonged to the generation of micro light emitting diodes. On the contrary, when the total thickness H is less than a certain value such as 1 um, it will increase the difficulty of the manufacturing processes. Therefore, the total thickness H may be 2 um, 3 um, or 4 um, for example. In some embodiments of the present disclosure, the collection of the third undoped III-V group semiconductor layer 240, the third N-type III-V group semiconductor layer 250, the light emitting layer 260, and the P-type III-V group semiconductor layer 270 may be referred to as the micro light emitting diode structure 300.

Figure 9:
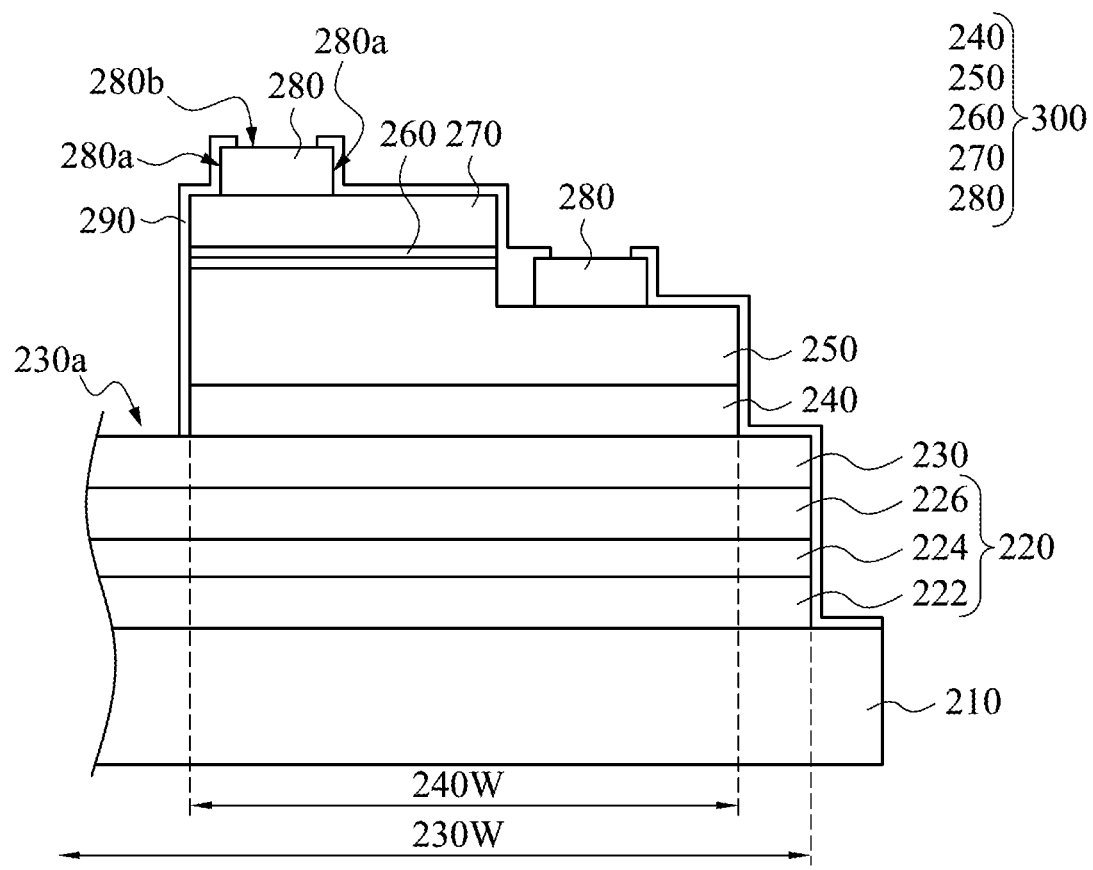
FIG. 9 is a cross-section view in one stage of a manufacturing process in accordance with various embodiments of the present disclosure.

Please refer to FIG. 9. The micro light emitting diode structure 300 may further include a pair of electrodes 280 formed respectively on the top surface of the P-type III-V group semiconductor layer 270 and the exposed top surface 250b (indicated in FIG. 8) of the third N-type III-V group semiconductor layer 250. In some embodiments of the present disclosure, the materials of the electrodes 280 may be metals with high work function (such as Ni, Au, Ag, Pd, and/or Pt). Next, the insulating layer 290 completely covers consecutively the III-V group semiconductor stacking layer 220, the sacrificial layer 230, the micro light emitting diode structure 300, the electrodes 280, and the portion 230a of the top surface of the sacrificial layer 230 over the substrate 210. In some embodiments of the present disclosure, the material of the insulating layer 290 has been described hereinbefore, and the details are not repeated herein. In some embodiments of the present disclosure, the insulating layer 290 is formed by chemical vapor deposition processes, printing processes, coating processes, or other suitable processes. To be specific, the insulating layer 290 has a thickness ranged from about 500 Å to about 10000 Å. According to various embodiments, when the thickness of the insulating layer 290 is greater than a certain value such as 10000 Å, it will lead to an increase in the manufacturing cost. On the contrary, when the thickness of the insulating layer 290 is less than a certain value such as 500 Å, the supporting force provided in the process is insufficient. Therefore, the thickness of the insulating layer 290 may be 550 Å, 600 Å, 650 Å, 700 Å, 750 Å, 800 Å, 850 Å, 900 Å, 950 Å, for example.

Please refer to FIG. 9. By the lithography and etching processes, the insulating layer 290 disposed on the portion 230a of the top surface of the sacrificial layer 230 and the side wall of the III-V group semiconductor stacking layer 220 adjacent to the portion 230a of the top surface are removed by etching so as to expose the portion 230a of the top surface of the sacrificial layer 230 and the side wall of the III-V group semiconductor stacking layer 220. Simultaneously, the portion of the insulating layer 290 on the electrodes 280 is etched away so to expose the electrodes 280.

Figure 10:
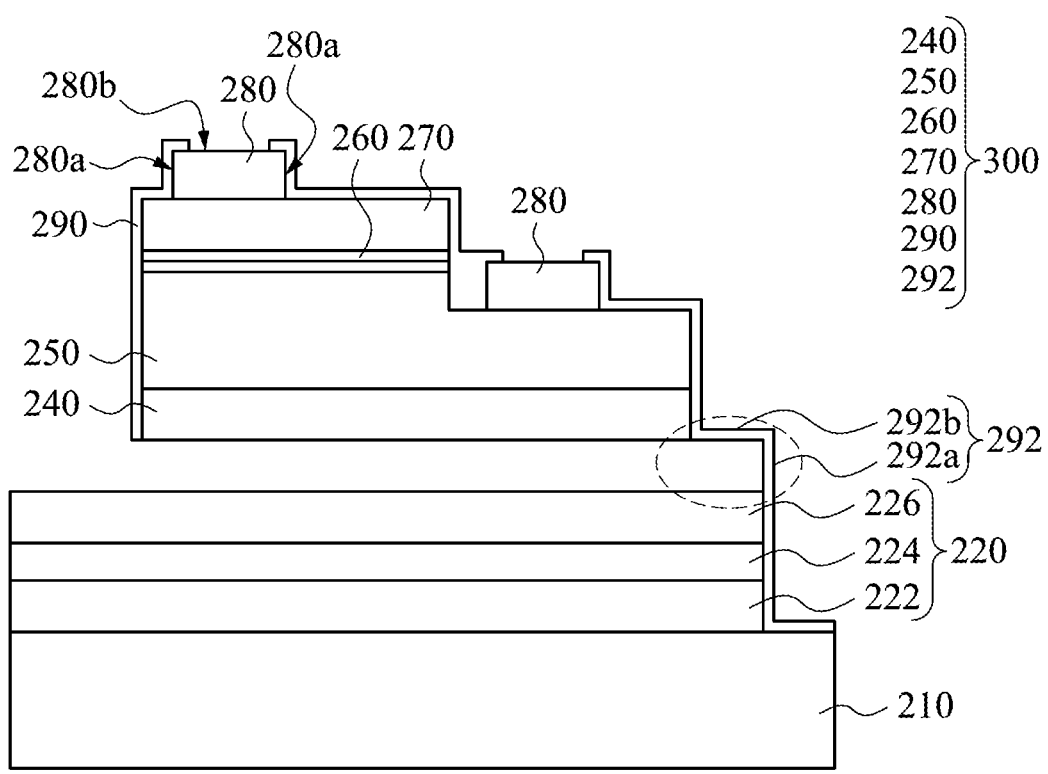
FIG. 10 is a cross-section view in one stage of a manufacturing process in accordance with various embodiments of the present disclosure.

Please refer to FIG. 10. Next, an electrochemical selective etching process is used to etch the sacrificial layer 230. In some embodiments, the sacrificial layer 230 is completely etched by an electrochemical elective etching solution through the exposed portion 230a of the top surface of the sacrificial layer 230. For example, the electrochemical etching solution may be a sulfuric acid ($H_2SO_4$) solution, a nitric acid ($HNO_3$) solution, a phosphoric acid ($H_3PO_4$) solution, a sodium hydroxide (NaOH) solution, a potassium hydroxide (KOH) solution, an ammonia ($NH_3$) solution, or other suitable etching solutions. To be specific, the structure as shown in FIG. 9 is completely immersed in the electrochemical etching solution. The side wall of the first N-type III-V group semiconductor layer 224 contacts the cathode, and the anode is placed in the electrochemical etching solution. Next, a voltage is applied for performing the electrochemical selective etching process. It is noted that the silicon doping concentration of the sacrificial layer 230 mentioned above is greater than about $3\times10^{19}$ cm$^{-3}$, and the silicon doping concentration of the first N-type III-V group semiconductor layer 224 is ranged from about $1\times10^{18}$ cm$^{-3}$ to about $1 \times 10^{19}$ cm$^{-3}$. According to various embodiments, when the silicon doping concentration of the first N-type III-V group semiconductor layer 224 is greater than a certain value such as $1 \times 10^{19}$ cm$^{-3}$, the silicon doping concentration of the first N-type III-V group semiconductor layer 224 may substantially close to the silicon doping concentration of the sacrificial layer 230, thereby causing the first N-type III-V group semiconductor layer 224 to be etched. On the contrary, when the silicon doping concentration of the first N-type III-V group semiconductor layer 224 in the III-V group semiconductor stacking layer 220 is less than a certain value such as $1 \times 10^{18}$ cm$^{-3}$, it cannot provide sufficient conductivities in the electrochemical etching process. Because the silicon doping concentration of the sacrificial layer 230 is greater than that of the first N-type III-V group semiconductor layer 224, the current density (equivalent to the etching rate) of the current flowing past the sacrificial layer 230 is greater than that of the first N-type III-V group semiconductor layer 224 in the electrochemical etching process. In other words, the electrochemical etching solution selectively etches the sacrificial layer 230 with the silicon doping concentration greater than $3 \times 10^{19}$ cm$^{-3}$, and substantially keeps the first N-type III-V group semiconductor layer 224 from being over-etched.

As shown in FIG. 10, after the sacrificial layer 230 is etched completely, a portion of the insulating layer 290 may constitute a supporting frame 292, and the micro light emitting diode structure 300 is suspended over the III-V group semiconductor stacking layer 220 by the supporting frame 292. To be specific, the supporting frame 292 extends from the side wall of the third undoped N-type III-V group semiconductor layer 240 of the micro light emitting diode structure 300 along the outer edge of the sacrificial layer 230, which has not yet been etched, to the side wall of the III-V group semiconductor stacking layer 220. The supporting frame 292 may include a first part 292a and a second part 292b. The first part 292a is parallel to the thickness direction of the sacrificial layer 230, and the second part 292b is perpendicular to the thickness direction of the sacrificial layer 230. Finally, breaking the supporting frame 292 of the insulating layer 290, thereby forming an individual micro light emitting diode 300. It is noted that the breakage site of the supporting frame 292 of the insulating layer 290 may be at the first part 292a, at the second part 292b, or at an intersection of both to form the extension portion 292c (shown in FIG. 11) of the insulating layer 290.

In some embodiments of the present disclosure, the individual micro light emitting diode 300 may be disposed over the die-bonding substrate 110 to form the micro light emitting diode structure 400 as shown in FIG. 11. In addition, the adhesive layer 120 may be formed on the die-bonding substrate 110 first, and then the individual micro light emitting diode 300 may be disposed on the adhesive layer 120 to enhance the adhesion there between. It is noted that the individual micro light emitting diode 300 includes the extension portion 292c of the insulating layer 290, and the extension portion 292c is used to increase the area of die-bonding. The various features of the micro light emitting diode structure 400 as shown in FIG. 11 have been described hereinbefore, and the details are not repeated herein.

As comparing to the techniques for separating the micro light emitting diode 300 from the sapphire substrate 210 by chemical etching or laser lift-off (LLO) techniques in the prior arts, the method for manufacturing the micro light emitting diode disclosed in the present invention can reduce the cost of the process and reduce the transfer time of the micro light emitting diode without using the high-cost equipment such as LLO. In addition, the embodiments disclosed herein also overcome the problem of yield loss after the mass transfer in the micro-size generation.

Although the present invention has been described in considerable detail with reference to certain embodiments thereof, other embodiments are possible. Therefore, the spirit and scope of the appended claims should not be limited thereto the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A micro light emitting diode structure, comprising:
a die-bonding substrate;
an adhesive layer disposed on the die-bonding substrate;
an undoped III-V group semiconductor layer in contact with a top surface of the adhesive layer, the adhesive layer disposed between the die-bonding substrate and the undoped III-V group semiconductor layer;
an N-type III-V group semiconductor layer disposed on the undoped III-V group semiconductor layer;
a light emitting layer disposed on the N-type III-V group semiconductor layer;
a P-type III-V group semiconductor layer disposed on the N-type III-V group semiconductor layer, wherein the light emitting layer is disposed between the N-type III-V group semiconductor layer and the P-type III-V group semiconductor layer; and
an insulating layer covering at least a side wall of the undoped III-V group semiconductor layer, a side wall of the N-type III-V group semiconductor layer, a side wall of the light emitting layer, and a side wall of the P-type III-V group semiconductor layer, wherein the insulating layer has an extension portion extending from a junction of the side wall of the undoped III-V group semiconductor layer and the adhesive layer, and the extension portion is in contact with the top surface of the adhesive layer.

2. The micro light emitting diode structure of claim 1, wherein the undoped III-V group semiconductor layer, the N-type III-V group semiconductor layer, the light emitting layer, and the P-type III-V group semiconductor layer collectively have a total thickness ranged from about 1 um to about 5 um.

3. The micro light emitting diode structure of claim 1, wherein the insulating layer has a thickness ranged from about 500 Å to about 10000 Å.

* * * * *